(12) United States Patent
Wang et al.

(10) Patent No.: US 8,765,363 B2
(45) Date of Patent: Jul. 1, 2014

(54) METHOD OF FORMING A RESIST PATTERN WITH MULTIPLE POST EXPOSURE BAKING STEPS

(75) Inventors: Chung-Ming Wang, Chiayi (TW); Yu Lun Liu, Beidou Township, Changhua County (TW); Chia-Chu Liu, Shin-Chu (TW); Kuei-Shun Chen, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 84 days.

(21) Appl. No.: 13/478,559

(22) Filed: May 23, 2012

(65) Prior Publication Data
US 2013/0316510 A1 Nov. 28, 2013

(51) Int. Cl.
*G03F 7/38* (2006.01)

(52) U.S. Cl.
USPC .......................................... 430/330

(58) Field of Classification Search
USPC .......................... 430/311, 313, 330
See application file for complete search history.

(56) References Cited

U.S. PATENT DOCUMENTS

| | | | |
|---|---|---|---|
| 5,717,612 A * | 2/1998 | Capodieci | 703/12 |
| 2010/0119960 A1 * | 5/2010 | Fonseca et al. | 430/30 |

* cited by examiner

*Primary Examiner* — Kathleen Duda
(74) *Attorney, Agent, or Firm* — Haynes and Boone, LLP

(57) ABSTRACT

A method of forming a integrated circuit pattern. The method includes coating a photoresist layer on a substrate; performing a lithography exposure process to the photoresist layer; performing a multiple-step post-exposure-baking (PEB) process to the photoresist layer; and developing the photoresist layer to form a patterned photoresist layer.

20 Claims, 6 Drawing Sheets

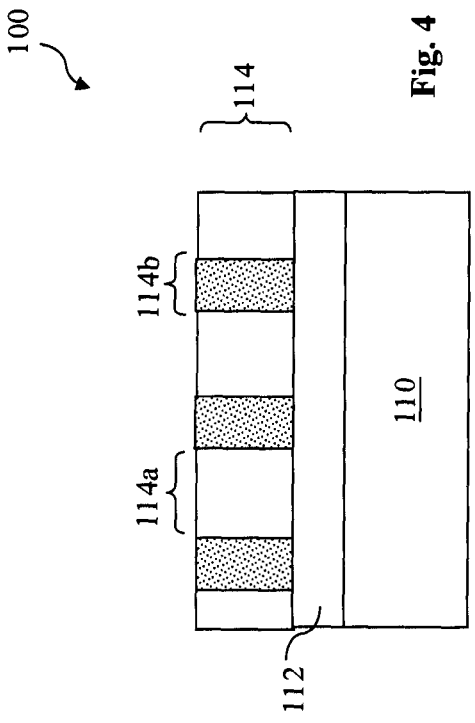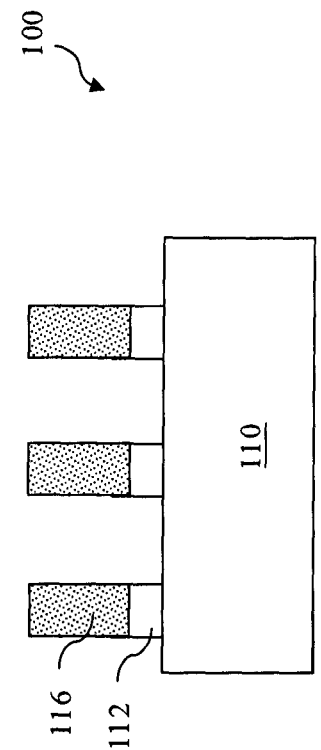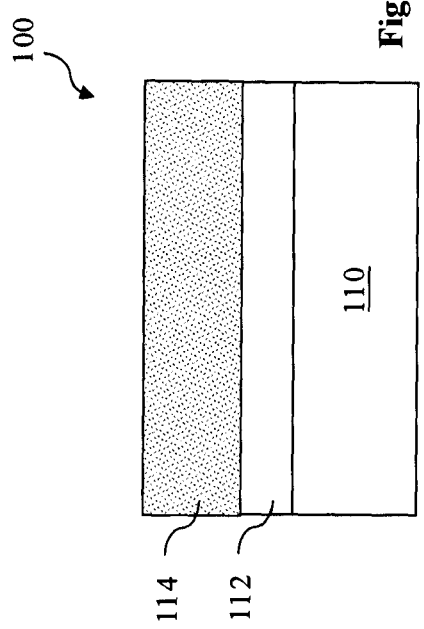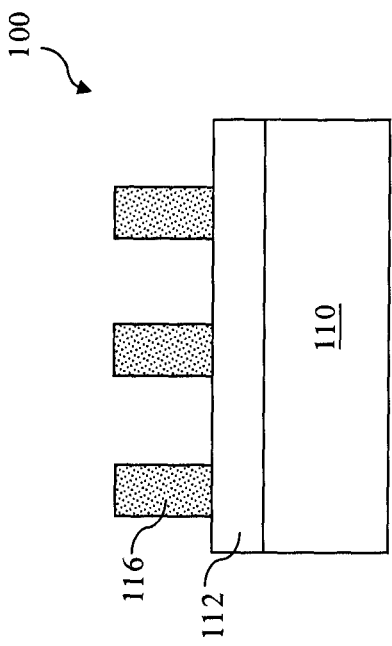

METHOD OF FORMING A RESIST PATTERN WITH MULTIPLE POST EXPOSURE BAKING STEPS

BACKGROUND

A patterned photoresist layer is formed by a lithography process and is used to pattern various material layers during integrated circuit (IC) fabrication. However, the photoresist scum may be generated during the lithography process. The scum may change critical dimension (CD) and cause the deviation of the patterned IC features, which may further introduce performance and reliability issues and even device failures.

Semiconductor technologies are continually progressing to smaller feature sizes, down to 65 nanometers, 45 nanometers, and below. The scum associated issues are more serious when the CD is smaller. Achieving a target CD is even more challenging for advanced technology nodes.

BRIEF DESCRIPTION OF THE DRAWINGS

Aspects of the present disclosure are best understood from the following detailed description when read in conjunction with the accompanying figures. It is noted that, in accordance with the standard practice in the industry, various features are not drawn to scale. In fact, the dimensions of various features may be arbitrarily increased or reduced for clarity of discussion.

FIGS. 3, 4, 5, 6, 13, and 14 are sectional side views of one embodiment of a semiconductor structure, during various fabrication stages.

DETAILED DESCRIPTION

Figure 1C:
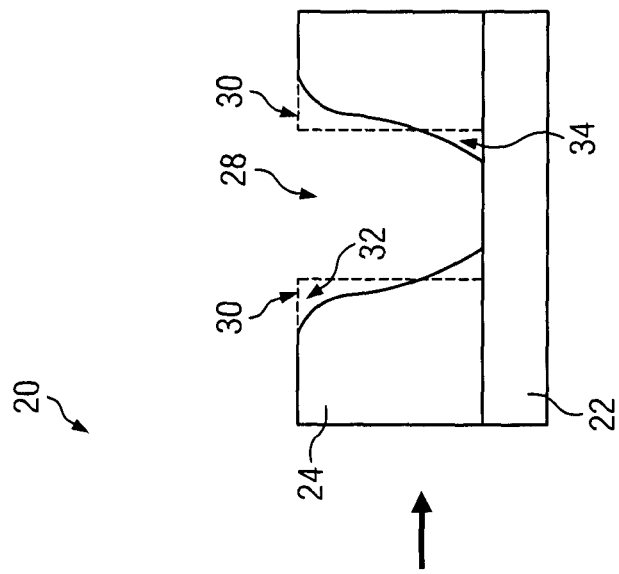
FIGS. 1a through 1c illustrate sectional views of one exemplary semiconductor device having a photosensitive layer being exposed during a lithography process.

It is understood that the following disclosure provides many different embodiments, or examples, for implementing different features of various embodiments. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Figure 1B:
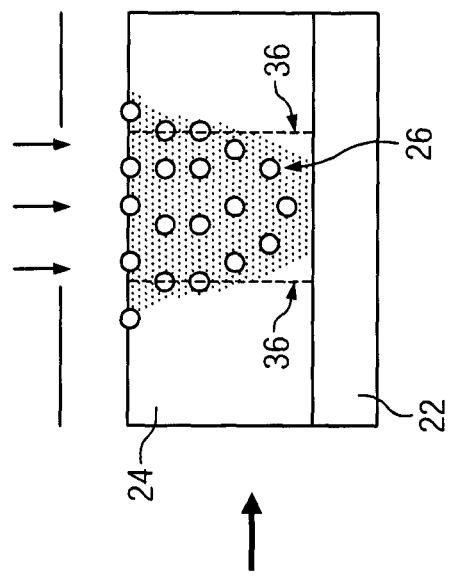
Figure 1A:
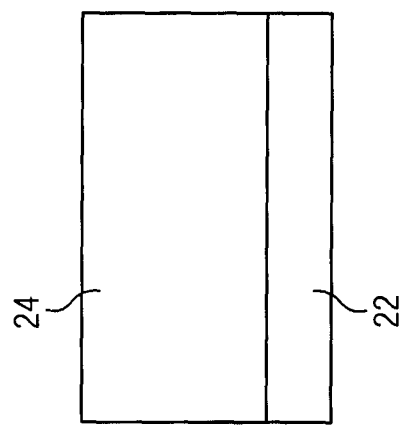

FIGS. 1a through 1c provide sectional views of a semiconductor device 20 at various lithography processing stages. In one lithography process for patterning a substrate 22, a photoresist (or resist) layer 24 is coated on the substrate 22 as shown in FIG. 1a. Then an ultraviolet (UV) beam is applied to the resist layer 24 during an exposure process, generating acid 26 in the exposed resist. After post exposure baking (PEB) and developing by a basic solution, an opening 28 is revealed. An ideal profile of the patterned resist 24 is illustrated by dashed lines 30 in FIG. 1c. The real patterned resist 24 has a different profile that includes top rounding 32 and/or footing 34 (scum profile). When the resist material is coated on a silicon nitride layer, the silicon nitride may react with the resist to form additional scum, further degrading the patterned resist layer.

The deformed resist layer with top round and/or footing is explained as below. During the lithography exposure process, the light intensity decreases due to the light absorption by the resist component (such as the photo acid generator) and scattering. Therefore, the upper portion and the lower portion of the resist layer receives uneven radiation energy during the lithography exposure process. Therefore, the photo-generated acid is not evenly distributed within the exposed regions (as defined between dashed lines 36 in FIG. 1b) of the resist layer 24 from top to bottom. The exposure dose received by the upper portion is greater than the exposure dose received by the lower portion. Accordingly, there is more photo-generated acid in the upper portion than that in the lower portion. Considering the factor of acid diffusion in the resist layer, the top portion of the resist layer within the unexposed regions may have more acids diffused from the adjacent top portion of the resist layer within the exposed region such that those unexposed regions have acid greater than the threshold. The threshold represents an acid level just enough such that the exposed resist (for positive tone resist or the unexposed resist for negative tone resist) is developed and removed during the developing process. Thus, those unexposed top portions are removed during the developing process (assuming the resist layer is positive tone), resulting in a deformed resist pattern with top rounding 32. In another example, the lower portions of the resist layer within the exposed regions may have less acid relative to the threshold such that those portions are not removed during the developing process, resulting in resist footing 34.

Figure 2:
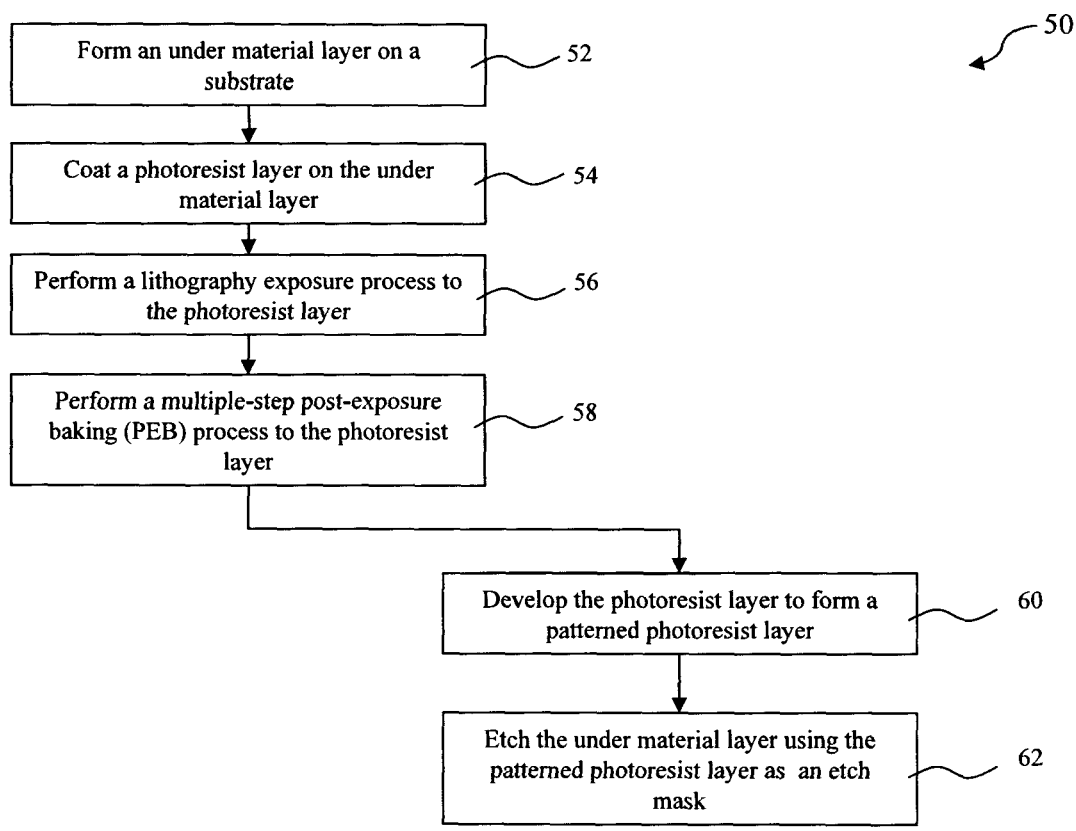
FIG. 2 is a flowchart showing one embodiment of a method of lithography patterning process.

FIG. 2 is a flowchart showing one embodiment of a method 50 of lithography patterning. FIGS. 3-6 and 11-12 are sectional side views showing one embodiment of a semiconductor structure 100 during various successive fabrication stages. FIGS. 7-10 are graphic views of an post-exposure baking (PEB) process, constructed according to aspects of the present disclosure in various embodiments. With reference to various figures, the method 50 for lithography patterning and the semiconductor structure 100 made by the same are described.

The method 50 begins with a semiconductor structure 100 illustrated in FIG. 2. The semiconductor structure 100 includes a substrate 110, such as a silicon wafer. The substrate 110 may alternatively be made of other suitable semiconductor material, including Ge, SiGe, or GaAs. Further, the substrate 110 may be made of another suitable elementary semiconductor such as diamond; a suitable compound semiconductor such as silicon carbide, indium arsenide, or indium phosphide; or a suitable alloy semiconductor such as silicon germanium carbide, gallium arsenic phosphide, or gallium indium phosphide. The substrate 110 may include various doped regions, dielectric features, and multilevel interconnects. The substrate 110 may alternatively be a non-semiconductor material, such as a glass substrate for thin-film-transistor liquid crystal display (TFT-LCD) devices, or fused quartz or calcium fluoride for a photomask (mask or reticle). The substrate 110 may include one or more other material layers to be patterned, such as a poly-silicon layer, a conductive layer, a dielectric layer, or multiple layers of various materials.

Referring to FIGS. 2 and 3, the method 50 may include an operation 52 by forming an under material layer 112 on the substrate 110. The under material layer 112 may function as a hard mask layer for subsequent process, such as etch or ion implantation. In one embodiment, the under material layer 112 includes silicon nitride (SiN). In the present example, the under material layer 112 includes a silicon oxide film disposed on the substrate and a silicon nitride film disposed on the silicon oxide film.

Referring to FIGS. 2 and 4, the method 50 proceeds to an operation 54 by coating a photoresist layer (or resist layer) 114 on the substrate 110. In the present embodiment, the photoresist is formed on the under material layer 112. Resist layer 114 is either a positive-type or a negative-type photoresist. Resist layer 114 is coated by a proper technique, such as spin-on coating. Resist layer 114 is formed to have a suitable thickness with enough etch resistance (or implantation resistance). In one example, the resist layer 114 has a thickness ranging between about 500 angstroms and about 5000 angstroms. In another example, the resist layer 114 may have a thickness ranging between about 1000 angstroms and 2000 angstroms.

In the present embodiment, the resist layer 114 utilizes a chemically amplified (CA) resist material. The resist layer 114 includes a polymeric material as a matrix to provide various properties of the photoresist, such as resisting etch or ion implantation. In one example, the polymeric material of the resist layer 114 includes a polymer resin. In one embodiment, a positive CA resist material includes a polymer material that turns soluble to a developer such as a base solution after the polymer is reacted with acid. Alternatively, the CA resist material can be negative and include a polymer material that turns insoluble to a developer such as a base solution after the polymer is reacted with acid.

The resist layer 114 further includes a solvent filling inside the polymer. The solvent may be partially evaporated by a soft baking process. The resist layer 114 also includes a photo-sensitive component that is sensible to a radiation energy, such as ultraviolet (UV) light or deep ultra-violet (DUV) light in one example. In one example, the photosensitive component of the resist layer 114 includes photo-acid generator (PAG) distributed in the polymeric material. The PAG generates acid upon being exposed to proper UV light beam.

After the resist layer 114 is coated on the substrate 110, a soft baking process may be implemented to partially drive out the solvent from the resist layer 114. The resist coating and soft baking may performed in one or more suitable tools, such as a track designed and configured to perform various resist-related processes including coating and baking.

Referring to FIGS. 2 and 4, the method 50 proceeds to an operation 56 by performing a lithography exposure process to the resist layer 114. The semiconductor structure 100 may be transferred to a lithography apparatus for an exposure process. In one embodiment of the exposure process, the resist layer 114 is exposed to a radiation energy (such as UV light) through a photomask (mask or reticle) having a predefined pattern, resulting in the resist layer 114 with a latent pattern that includes a plurality of exposed regions 114a and a plurality of unexposed regions 114b. As examples, the radiation energy may include a 248 nm beam by Krypton Fluoride (KrF) excimer lasers or a 193 nm beam by Argon Fluoride (ArF) excimer lasers.

In one embodiment, the exposure process utilizes an immersion photolithographic technique. In this case, an immersion fluid is disposed between the semiconductor device 100 and the projection lens of the lithography apparatus. The immersion fluid may include de-ionized water (DI water or DIW).

In the present embodiment, the resist layer 114 is positive. Through the interaction between the PAG and the radiation energy, acid is generated in the exposed region 114a of the resist layer 114. As mentioned earlier, various factors may introduce a deviation from the uniformly distributed acids. For example, light absorption causes the light density to be less in the bottom of the resist layer, therefore, less acid is generated there. In another example, the topography issue (rough surface) introduces diffraction and further degrades the distribution of the generated acid.

The method 50 proceeds to an operation 58 by performing a multi-step post-exposure-baking (PEB) process to the exposed resist layer 114. Instead of one step PEB process, the multi-step PEB process is applied to the exposed resist layer 114.

During the PEB process, the amount of acid is amplified, such as by hundreds or thousands times. As in one-step PEB process, the baking temperature properly tuned to eliminate both overdose and under-dose issues. It is especially hard when the feature size gets smaller and when the under material layer has reaction with the resist layer to further generate scum.

The present disclosure provides a multiple-step PEB process tuned to eliminate both the overdose and under-dose issues since multiple baking temperatures in the multiple-step PEB process provide more freedom to optimize the PEB process. The multiple-step PEB process achieves a PEB process with different baking temperatures or at least two different baking temperatures, such as a lower baking temperature and a higher baking temperature greater than the lower baking temperature.

As the resist layer 114 has a certain thickness such that the upper portion and the lower portion of the resist layer receives uneven radiation energy during the lithography exposure process. Therefore, the photo-generated acid is not evenly distributed within the exposed regions of the resist layer from top to bottom. In a particular example, the exposure dose received by the upper portion is greater than the exposure dose received by the lower portion. Accordingly, there is more photo-generated acid in the upper portion than that in the lower portion. Considering the factor of acid diffusion in the resist layer, the top portion of the resist layer within the unexposed regions may have more acids diffused from the adjacent top portion of the resist layer within the exposed region such that those unexposed regions have acid greater than the threshold. Thus, those unexposed top portions are removed during the developing process (assuming the resist layer is positive tone), resulting in a deformed resist pattern, such as a top rounding pattern. In another example, the lower portions of the resist layer within the exposed regions may have less acid relative to the threshold such that those portions are not removed during the developing process, resulting in resist footing defects.

In the disclosed method, instead of applying an one-step PEB process, a multiple-step PEB process is applied with two or more baking temperatures with more tuning freedom to eliminate or reduce the overdose or under-dose issues. Particularly, the multiple-step PEB process is tuned such that the thermal budget is low without causing the overdose issues in the upper portions of the resist layer. The multiple-step PEB process is tuned such that at least one of the baking temperature is high enough without causing the under-dose issue in the lower portions of the resist layer.

Figure 7:
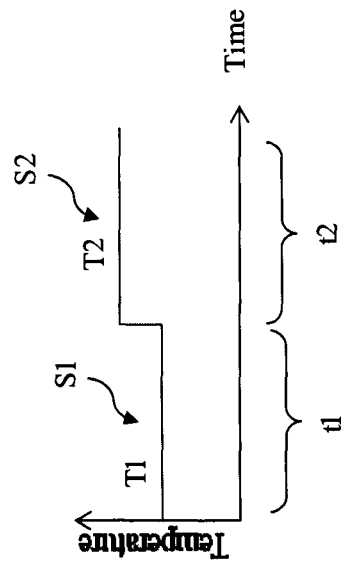
FIGS. 7, 8, 9, 10, 11 and 12 are graphic view of a post exposure baking (PEB) process of the lithography patterning process in FIG. 1, constructed according to aspects of the present disclosure in various embodiments.

In one embodiment, the multiple-step PEB process has a baking temperature profile illustrated in FIG. 7. The horizontal axis presents time and the vertical axis represent baking temperature. The multiple-step PEB process includes a first baking step S1 having a first baking temperature T1 and a second baking step S2 having a second baking temperature T2 that is different from the first baking temperature T1. Particularly, the first baking temperature T1 is greater than the second baking temperature T2. The first baking step has a first baking duration t1 and the second baking step has a second baking duration t2, as illustrated in FIG. 6. In one embodiment, the first baking duration t1 is different from the second baking s duration t2.

In one embodiment, the different between the first baking temperature T1 and the second baking temperature T2 ranges between about 5° C. and about 20° C. In another embodiment, each the first baking temperature T1 and the second baking temperature T2 ranges between about 70° C. and about 140° C.

As one example, when the corresponding one-step PEB process has a baking temperature of about 110° C. and a baking duration of about 90 seconds, the two-step PEB process includes the first PEB step having the first baking temperature T1 of about 105° C. and the first baking duration t1 ranging between about 40 and about 80 second (or sec) and the second PEB step having the second baking temperature T2 of about 115° C. and the second baking duration t2 ranging between about 20 and 40 second.

Figure 8:
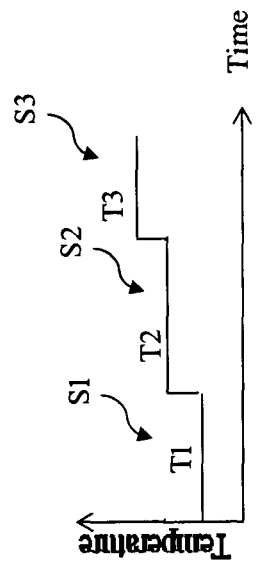

FIG. 8 is a schematic view of a graph illustrating the multiple-step PEB process constructed according to another embodiment. The baking temperature profile of the multiple-step PEB process in FIG. 8 is similar to the baking temperature profile of the multiple-step PEB process in FIG. 7 but the first baking temperature T1 is less than the second baking temperature T2. For example, when the corresponding one-step PEB process has a baking temperature of about 110° C. and a baking duration of about 90 seconds, the two-step PEB process includes the first PEB step having the first baking temperature T2 of about 115° C. and the first baking duration t2 ranging between about 20 and 40 second, and the second PEB step having the second baking temperature T1 of about 105° C. and the second baking duration t1 ranging between about 40 and 80 second.

In another embodiment, the multiple-step PEB process includes more than two baking steps each having a respective baking temperature different from other baking temperatures associated with the other baking steps. In one example, the multiple-step PEB process includes three baking steps having three distinctive baking temperatures, respectively. Specifically, each of the three baking temperatures is different from others. The multiple-step PEB process includes a step-wise thermal profile such that each step has a respective baking temperature higher than the baking temperature of the preceding step. In alternative example, the multiple-step PEB process includes a step-wise thermal profile such that each step has a respective baking temperature lower than the baking temperature of the preceding step.

Figure 9:
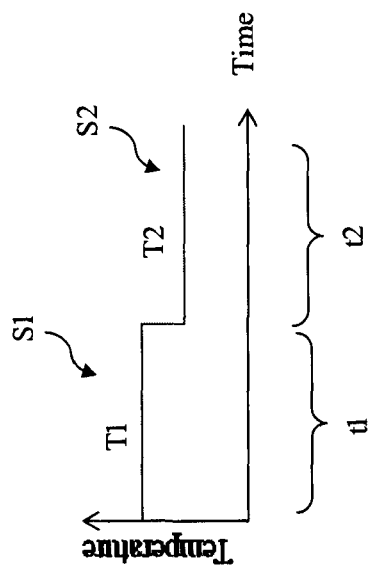

One example of the PEB process having three baking steps is illustrated in FIG. 9. Particularly, the baking temperature T1 in the first baking step S1 is greater than the baking temperature T2 in the second baking step S2. The baking temperature T2 in the second baking step S2 is greater than the baking temperature T3 in the third baking step S3.

Figure 10:
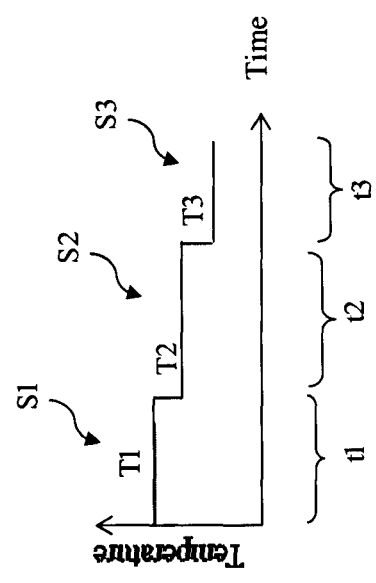

Another example of the PEB process having three baking steps is illustrated in FIG. 10. Particularly, the baking temperature T1 in the first baking step S1 is less than the baking temperature T2 in the second baking step S2. The baking temperature T2 in the second baking step S2 is less than the baking temperature T3 in the third baking step S3.

In yet another embodiment, the multiple-step PEB process includes a step-wise thermal profile with a number of steps and each step has a small duration. The overall thermal budget is similar to those with two or three baking steps. In an extreme case, the multiple-step PEB process includes a step-wise thermal profile with an infinite number of steps and each step has an infinitely small duration such that the baking temperature continuously varies over the baking time. Two examples are illustrated in FIGS. 11 and 12 and explained below.

Figure 11:
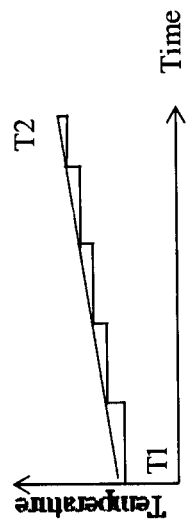

FIG. 11 is a schematic view of a graph illustrating the multiple-step PEB process constructed according to one or more embodiments. One embodiment is illustrated in the step-wise baking profile. In another embodiment, the PEB process has a thermal profile so the baking temperature continuously increases over the baking time. In a particular example, the thermal profile has a linear relationship between the baking temperature and the time. State differently, the baking temperature linearly changes with a constant temperature change rate through the PEB process. The constant temperature change rate is a positive constant or greater than zero.

Figure 12:
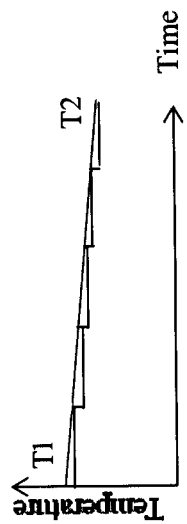

FIG. 12 is a schematic view of a graph illustrating the multiple-step PEB process constructed according to one or more embodiments. One embodiment is illustrated in the step-wise baking profile. In another embodiment, the multiple-step PEB process has a thermal profile so the baking temperature continuously decreases over baking time. In a particular example, the thermal profile has a linear relationship between the baking temperature and the time. The baking temperature linearly changes with a constant temperature change rate through the PEB process. In this embodiment, the constant temperature change rate is a negative constant or less than zero. It is understood that the multiple-step PEB process is not limited to the various embodiments described above.

Back to FIG. 2, the method 50 proceeds to an operation 60 by performing a developing process. During the developing process, the resist layer 114 within the exposed regions (or alternatively unexposed regions) is removed, forming a patterned resist layer 116 as illustrated in FIG. 5. The patterned resist layer 116 includes one or more openings that expose the substrate or the underlying material layer.

Various advantages of the disclosed method may be present in one or more embodiments. In one example, the patterned resist layer 116 has eliminated or reduced defects (top rounding defects and footing defects). In one embodiment where the under material layer 112 is present and the under material layer 112 includes silicon nitride, the disclosed method may substantially improve the patterning effect of the resist layer.

During the developing process, a suitable developer (or developing solution) is applied to the resist layer. In one example, the developer includes tetramethyl ammonium hydroxide (TMAH) solution. In another example, the developer may includes other proper chemicals, such as negative tone developing solution such that the positive tone resist within unexposed regions is removed or the negative tone resist within exposed regions is removed thereby.

In one example, the developer is dispensed to the resist layer by spray or puddle. In another example, the developing process further includes one or more rinsing steps to remove the developer and clean the patterned resist layer by a suitable rinsing liquid, such as de-ionized water (DI-water). In yet another example, a hard baking step may further follow to remove the solvent and harden the patterned resist layer.

Other fabrication processes may be implemented using the patterned resist layer 116 as a mask. For example, an etch process is applied to the substrate using the patterned resist layer 116 as an etch mask. In another example, an ion implantation process is applied to the substrate using the patterned resist layer 116 as an implantation mask.

In the present example where the under material layer 112 is present, the method 50 may include an operation 62 by etching the under material layer 112 using the patterned resist layer 116 as an etch mask as illustrated in FIG. 6 as a section view of the semiconductor structure 100. The under material layer 112 is selectively etched through the openings of the patterned resist layer 116. Thus, the patterns defined in the patterned resist layer 116 are transferred to the under material layer 112 by the etching process. Afterward, the patterned resist layer 116 may be removed by wet stripping or plasma ashing.

Figure 14:
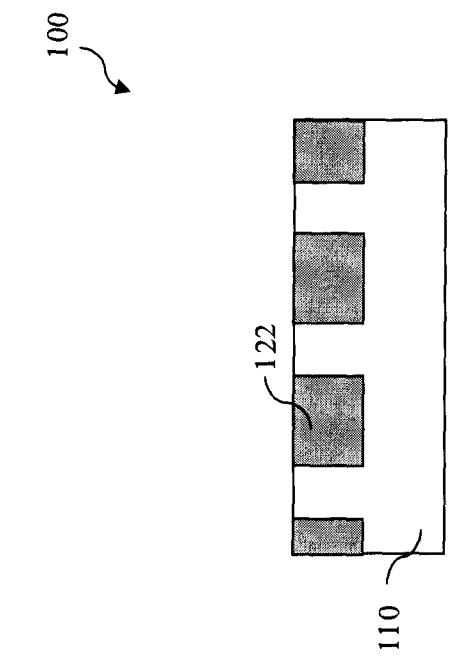
Figure 13:
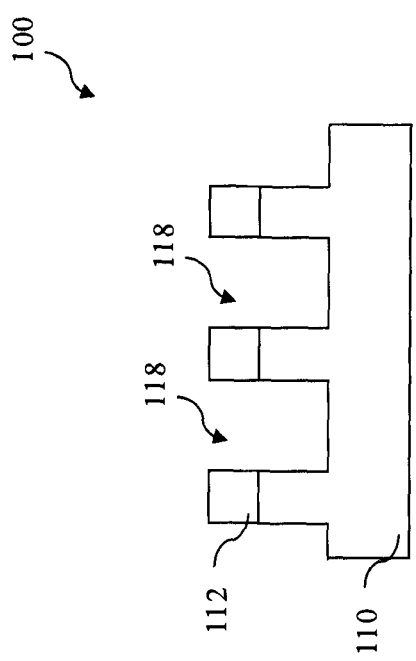

Other fabrication processes may be implemented before, during and/or after the method 50. One embodiment is described below only for illustration. In this embodiment, the under material layer 112 is used as a hard mask to form shallow trench isolation (STI) features in the substrate 110. Another etch process is applied to the substrate 110 through the openings of the patterned hard mask 112, forming one or more trenches 118 in the substrate 110 as illustrated in FIG. 13. Then, one or more dielectric material is filled in the trenches 118 to form one or more STI features 122, as illustrated in FIG. 14, by a procedure including dielectric deposition and chemical mechanical polishing (CMP).

In another embodiment, the under material layer 112 includes silicon nitride to function as an implantation mask. The silicon nitride layer is disposed on the substrate 110 and gate stacks. After the etch process to pattern the silicon nitride layer at operation 62, an ion implantation process is applied to the substrate 110 to selectively introduce impurity species (such as n-type dopant or p-type dopant) to portions of the substrate 110 through the openings of the mask layer 112 where other portions of the substrate are covered by the mask layer 112 from the ion implantation. In yet another embodiment, the under material layer 112 includes silicon nitride and is used as contact etch stop layer (CESL).

The method 50 of lithography patterning described above is according to various embodiments. Other changes, substitutions and alterations may be made herein without departing from the spirit and scope of the present disclosure. For example, the resist layer may be directly coated on semiconductor material (such as silicon), or other material layers. In another example, the resist layer may be coated on a bottom anti-reflective coating (BARC) layer. The method 50 may also be used to form or pattern other IC features, such as an etch process to form metal lines, or an etch process to form fin-like active regions.

The resist layer 114 may use different photosensitive material and may be a positive-tone or a negative-tone resist. For example, the resist material is negative-tone resist while the developer is chosen to be negative-tone developer. In an alternative example, the resist material is positive-tone resist while the developer is chosen to be negative-tone developer. In yet another example, the resist material is negative-tone resist while the developer is chosen to be positive-tone developer.

In one embodiment, the lithography process includes processing steps of resist coating, soft baking, exposing, PEB process, developing, and hard baking. In other embodiments, the lithography process may further include other steps, such as rinsing, cleaning or other baking steps.

In another embodiment, the radiation beam in the lithography exposure process may include other proper beams and use other exposure technologies. For example, the radiation beam may include electron-beam (e-beam) to be applied to the resist layer by writing or projection. In this case, the resist material is chosen and designed to be sensitive to e-beam. For example, the resist material may include polymethyl methacrylate (PMMA). When e-beam direct write mode is used, the photomask (or reticle) is eliminated during the lithography exposure process.

In another embodiment of the multiple-step PEB process, the higher temperature and the lower temperature may be tuned according to the characteristics of the resist material such that the footing and rounding issues can be effectively eliminated or reduced.

Thus, the present disclosure provides one embodiment of a method of forming a integrated circuit pattern. The method includes coating a photoresist layer on a substrate; performing a lithography exposure process to the photoresist layer; performing a multiple-step post-exposure-baking (PEB) process to the photoresist layer; and developing the photoresist layer to form a patterned photoresist layer.

In one embodiment, the multiple-step PEB process includes a first PEB step with a first baking temperature and a second PEB with a second baking temperature different from the first baking temperature.

A difference between the first and second baking temperatures may range between about 5° C. and about 20° C. The multiple-step PEB process may further include a third PEB step with a third baking temperature different from the first baking temperature and the second baking temperature.

The multiple-step PEB process may include a plurality of steps each having a respective baking temperature greater than a baking temperature at preceding step. Alternatively, the multiple-step PEB process may include a plurality of steps each having a respective baking temperature less than a baking temperature at preceding step.

The photoresist layer may include photoacid generator (PAG). In one embodiment, the method further includes forming an under material layer on the substrate before the coating a photoresist layer on a substrate; and performing a fabrication process to the under layer.

In various embodiments, the substrate may include silicon; the under material layer may include silicon nitride; and the fabrication process may include one of etch and ion implantation.

In one embodiment, the method may further include forming a silicon oxide layer on the substrate; forming a silicon nitride layer on the silicon oxide layer before the coating a photoresist layer on a substrate; etching the silicon nitride layer and the silicon oxide layer using the patterned photoresist layer as an etch mask; etching the substrate using the silicon nitride layer as a hard mask; forming a trench; depositing a dielectric material layer in the trench; and performing a chemical mechanical polishing (CMP) process to the dielectric material layer.

In another embodiment, the method may further include forming a gate stack on the substrate; forming a silicon nitride layer on the gate stack and the substrate before the coating a photoresist layer on a substrate; etching the silicon nitride layer within an opening of the patterned photoresist layer; and performing an ion implantation to the substrate using the silicon nitride layer as an implantation mask.

The present disclosure also provides another embodiment of a method that includes forming a silicon nitride layer on a semiconductor substrate; coating a photoresist layer on the silicon nitride layer; performing a lithography exposure process to the photoresist layer; performing a multiple-step post-exposure-baking (PEB) process to the photoresist layer; and developing the photoresist layer to form a patterned photoresist layer. The multiple-step PEB process includes a first PEB step having a first baking temperature and a second PEB step having a second baking temperature different from the first baking temperature.

The method may further include performing an etch process to the silicon nitride layer through openings of the patterned photoresist layer. In one embodiment, a difference between the first and second baking temperatures ranges between about 5° C. and about 20° C.

In another embodiment, the first PEB step has a first duration and the second PEB step has a second duration different from the first duration. The first baking temperature may be about 105° C. and the first duration ranging between about 40 seconds and about 60 seconds; and the second baking temperature may be about 115° C. and the second duration ranging between about 20 seconds and about 40 seconds.

The multiple-step PEB process may further include a third PEB step with a third baking temperature different from the first baking temperature and the second baking temperature.

The present disclosure also provides another embodiment of a method that includes coating a photoresist layer on a substrate; performing a lithography exposure process to the photoresist layer; performing a post-exposure-baking (PEB) process to the photoresist layer, wherein the PEB process includes a baking temperature that gradually changes through the PEB process; and developing the photoresist layer to form a patterned photoresist layer.

The baking temperature may vary linearly over time with a constant temperature change rate through the PEB process. In various embodiment, the constant temperature change rate is greater than zero or less than zero.

The foregoing has outlined features of several embodiments so that those skilled in the art may better understand the foregoing detailed description. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method of forming an integrated circuit pattern, the method comprising:
    coating a photoresist layer on a substrate;
    performing a lithography exposure process to the photoresist layer;
    performing a multiple-step post-exposure-baking (PEB) process to the photoresist layer, wherein the multiple-step PEB process includes a first PEB step having a first baking temperature and a second PEB step having a second baking temperature different from the first baking temperature, wherein no developing of the photoresist layer occurs between the first PEB step and the second PEB step; and
    after performing the multiple-step PEB process to the photoresist layer, developing the photoresist layer to form a patterned photoresist layer.

2. The method of claim 1, wherein a difference between the first and second baking temperatures ranges between about 5° C. and about 20° C.

3. The method of claim 1, wherein the multiple-step PEB process further includes a third PEB step with a third baking temperature different from the first baking temperature and the second baking temperature.

4. The method of claim 1, wherein the first baking temperature is greater than the second baking temperature.

5. The method of claim 1, wherein the first baking temperature is less than the second baking temperature.

6. The method of claim 1, wherein the photoresist layer includes photoacid generator (PAG).

7. The method of claim 1, further comprising:
    forming an under material layer on the substrate before the coating the photoresist layer on the substrate; and
    performing a fabrication process to the under layer.

8. The method of claim 7, wherein:
    the substrate includes silicon;
    the under material layer includes silicon nitride; and
    the fabrication process includes one of etch and ion implantation.

9. The method of claim 1, further comprising:
    forming a silicon oxide layer on the substrate;
    forming a silicon nitride layer on the silicon oxide layer before the coating the photoresist layer on the substrate;
    etching the silicon nitride layer and the silicon oxide layer using the patterned photoresist layer as an etch mask;
    etching the substrate using the silicon nitride layer as a hard mask, forming a trench;
    depositing a dielectric material layer in the trench; and
    performing a chemical mechanical polishing (CMP) process to the dielectric material layer.

10. The method of claim 1, further comprising:
    forming a gate stack on the substrate;
    forming a silicon nitride layer on the gate stack and the substrate before the coating the photoresist layer on the substrate;
    etching the silicon nitride layer within an opening of the patterned photoresist layer; and
    performing an ion implantation to the substrate using the silicon nitride layer as an implantation mask.

11. The method of claim 1, wherein the first PEB step has a first duration and the second PEB step has a second duration different from the first duration.

12. A method, comprising:
    forming a silicon nitride layer on a semiconductor substrate;
    coating a photoresist layer on the silicon nitride layer;
    performing a lithography exposure process to the photoresist layer;
    performing a multiple-step post-exposure-baking (PEB) process to the photoresist layer, wherein the multiple-step PEB process includes a first PEB step having a first baking temperature and a second PEB step having a second baking temperature different from the first baking temperature, wherein no developing of the photoresist layer occurs between the first PEB step and the second PEB step; and
    after performing the multiple-step PEB process to the photoresist layer, developing the photoresist layer to form a patterned photoresist layer.

13. The method of claim 12, further comprising performing an etch process to the silicon nitride layer through openings of the patterned photoresist layer.

14. The method of claim 12, wherein a difference between the first and second baking temperatures ranges between about 5° C. and about 20° C.

15. The method of claim 12, wherein the first PEB step has a first duration and the second PEB step has a second duration different from the first duration.

16. The method of claim 15, wherein:
- the first baking temperature is about 105° C. and the first duration ranges between about 40 seconds and about 80 seconds; and
- the second baking temperature is about 115° C. and the second duration ranges between about 20 seconds and about 40 seconds.

17. The method of claim 12, wherein the multiple-step PEB process further includes a third PEB step with a third baking temperature different from the first baking temperature and the second baking temperature.

18. A method, comprising:
- coating a photoresist layer on a substrate;
- performing a lithography exposure process to the photoresist layer;
- performing a post-exposure-baking (PEB) process to the photoresist layer, wherein the PEB process includes a baking temperature that gradually changes through the PEB process, wherein preforming the PEB process occurs without performing a development process on the photoresist layer; and
- after performing the (PEB) process to the photoresist layer, developing the photoresist layer to form a patterned photoresist layer.

19. The method of claim 18, wherein the baking temperature varies linearly over time with a constant temperature change rate through the PEB process.

20. The method of claim 19, wherein the constant temperature change rate is greater than zero or less than zero.

* * * * *